(12) United States Patent
Zhang et al.

(10) Patent No.: US 9,312,848 B2
(45) Date of Patent: Apr. 12, 2016

(54) GLITCH SUPPRESSION IN AN AMPLIFIER (71) Applicant: QUALCOMM Incorporated, San Diego, CA (US)

(72) Inventors: Xinwang Zhang, San Diego, CA (US); Vijayakumar Dhanasekaran, San Diego, CA (US); Le Wang, San Diego, CA (US); Ankit Srivastava, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 14/511,800

(22) Filed: Oct. 10, 2014

(65) Prior Publication Data

US 2015/0381161 A1 Dec. 31, 2015

Related U.S. Application Data (60) Provisional application No. 62/019,188, filed on Jun. 30, 2014, provisional application No. 62/019,552, filed on Jul. 1, 2014.

(51) Int. Cl.
*H03K 3/00* (2006.01)
*H03K 17/16* (2006.01)
*H03F 1/26* (2006.01)

(52) U.S. Cl.
CPC ............... *H03K 17/161* (2013.01); *H03F 1/26* (2013.01); *H03F 2200/372* (2013.01)

(58) Field of Classification Search
None
See application file for complete search history.

(56) References Cited

U.S. PATENT DOCUMENTS

| | | | |
|---|---|---|---|
| 5,926,012 A | 7/1999 | Takizawa et al. | |
| 6,127,746 A | 10/2000 | Clemente | |
| 7,417,473 B2 * | 8/2008 | Kawamoto | H03K 4/00 327/108 |
| 7,994,827 B2 | 8/2011 | Williams | |
| 8,749,222 B2 | 6/2014 | Williams | |
| 2006/0033551 A1 | 2/2006 | Dong et al. | |
| 2007/0103133 A1 | 5/2007 | Joos et al. | |
| 2013/0009671 A1 | 1/2013 | Suzuki et al. | |
| 2013/0229166 A1 | 9/2013 | Tetelbaum et al. | |

OTHER PUBLICATIONS

International Search Report and Written Opinion—PCT/US2015/038116—ISA/EPO—Aug. 4, 2015.

* cited by examiner

*Primary Examiner* — An Luu
(74) *Attorney, Agent, or Firm* — Fountainhead Law Group P.C.

(57) ABSTRACT

A driver circuit includes detectors responsive to the operating region that a driven switch is operating in. The driver circuit is operative to drive the gate of the driven switch at a speed responsive to the output of the detectors.

20 Claims, 10 Drawing Sheets

GLITCH SUPPRESSION IN AN AMPLIFIER

CROSS REFERENCE TO RELATED APPLICATIONS

Pursuant to 35 U.S.C. §119(e), this application is entitled to and claims the benefit of the filing date of U.S. Provisional App. No. 62/019,188 filed Jun. 30, 2014 and U.S. Provisional App. No. 62/019,552 filed Jul. 1, 2014, the content of both of which are incorporated herein by reference in their entireties for all purposes.

BACKGROUND

Unless otherwise indicated, the foregoing is not admitted to be prior art to the claims recited herein and should not be construed as such.

When a field effect transistor (FET) device switches between the ON state and the OFF state, charge built up in the gate redistributes across the source and drain terminals. This typically manifests itself as an extraneous signal in the output (e.g. at the drain terminal), which is sometimes referred to as switching glitch. The switching glitch in a FET device is proportional to $$\frac{di}{dt}$$

of the device, where i is the drain current.

Figure 9:
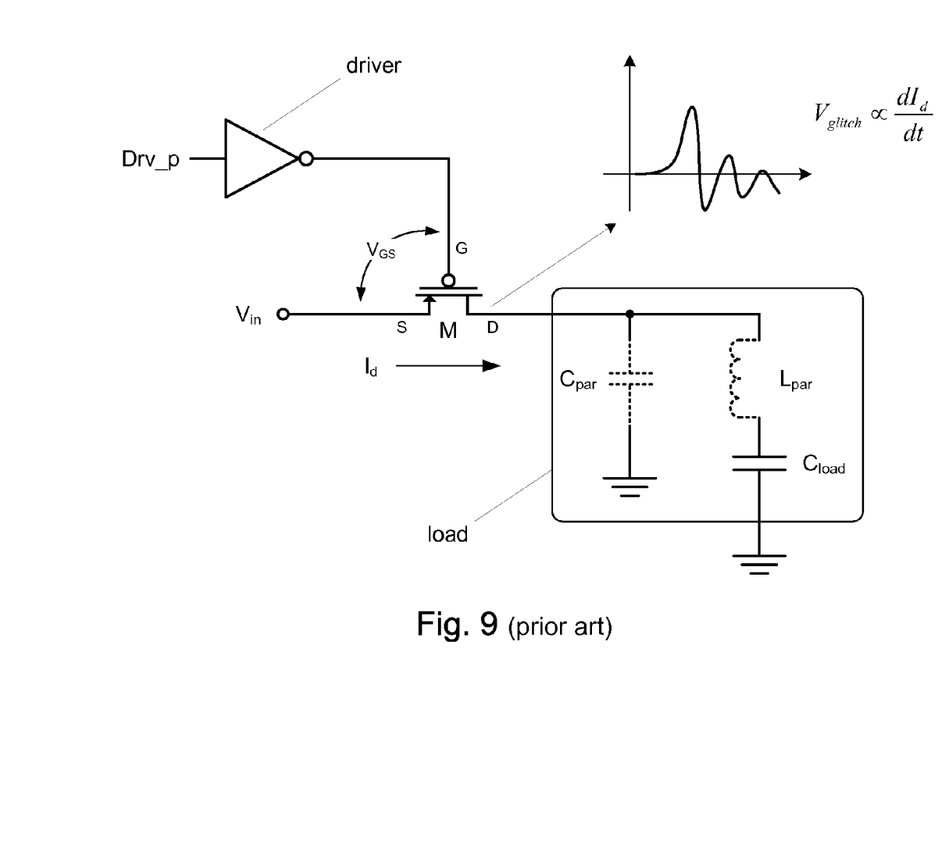
FIGS. 9 and 10 illustrate aspects of conventional circuitry.

Referring to FIG. 9, for example, in a typical driving scheme for a PMOS device M where the gate drive signal $V_{GS}$ is a linearly rising signal, $$\frac{dI_d}{dt}$$

during saturation is high, which can result in a large glitch. The device M typically will drive a load with a driving signal Drv_p. A driver may be used to boost or otherwise buffer the driving signal Drv_p (typically a small signal) so that the driving signal can operate the device M. As can be seen in FIG. 9, switching glitches can arise from the parasitic influences (e.g., parasitic capacitances $C_{par}$, parasitic inductances $L_{par}$ from the load, the wire routing, and so on) when device M switches from the OFF state to the ON state. In particular, the parasitic inductance and capacitance can create a sharp ringing voltage during the turning-on process of the switch, referred to as "switching glitch." When the device M is a switching element in a high power application such as a negative charge pump, a voltage regulator (e.g., buck regulator, boost regulator, etc.), a class D amplifier, and so on, the switching glitches can be significant.

Figure 10:
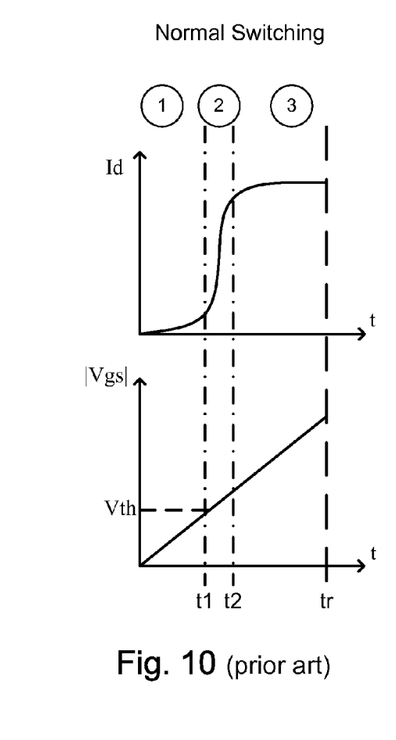

FIG. 10 shows the drain current $I_d$ profile as the gate drive voltage $V_{GS}$ increases. Operation of the an FET device is typically characterized by three operating regions (also shown in FIG. 10): region 1 (OFF or cutoff region), the device is non-conductive; region 2 (saturation region), the drain current $I_d$ flowing from the drain to the source of the FET transistor is the highest for the gate-source voltage $V_{GS}$ that is supplied; and region 3 (linear or ohmic region), where the device operates like a resistor.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
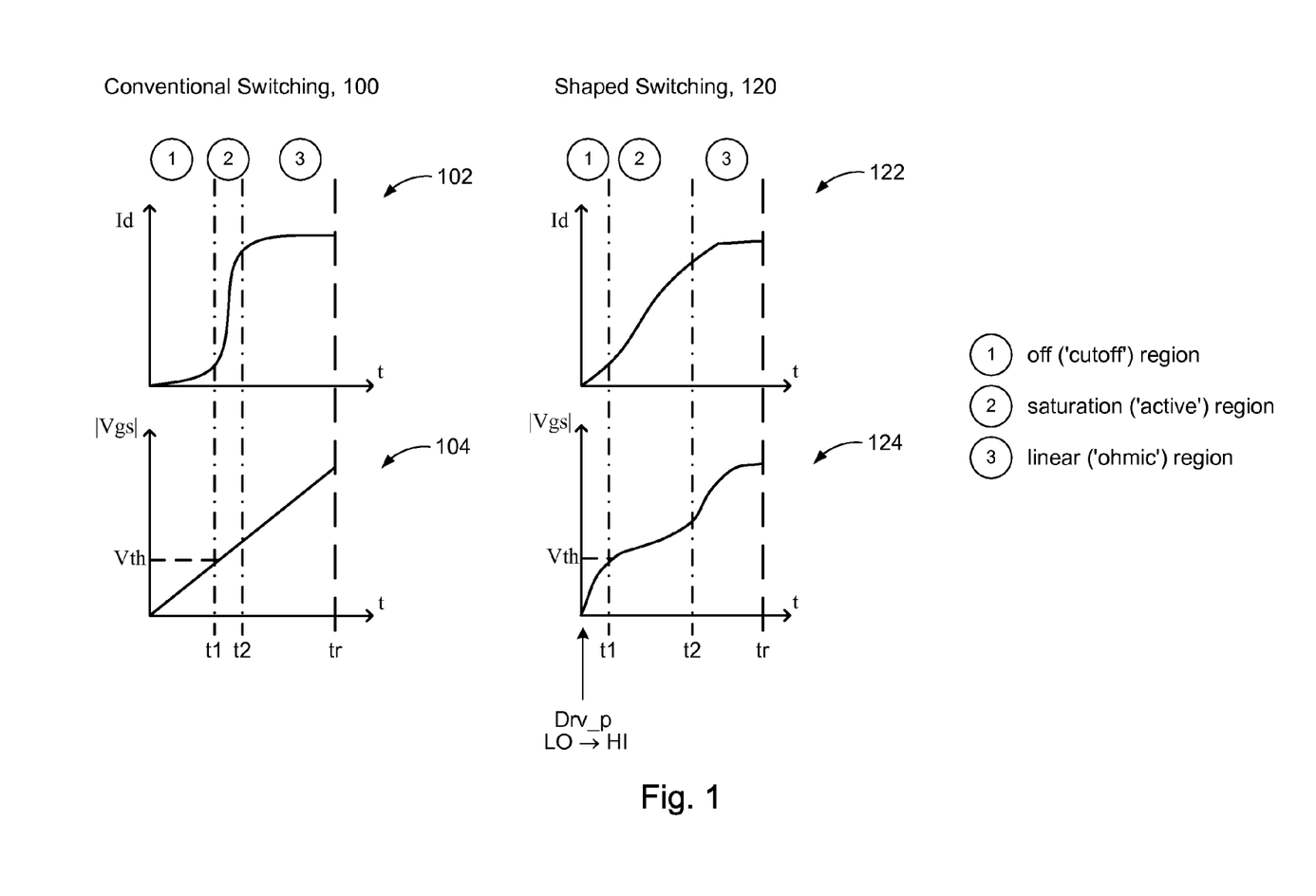
FIG. 1 illustrates shaped switching in accordance with the present disclosure.
Figure 2:
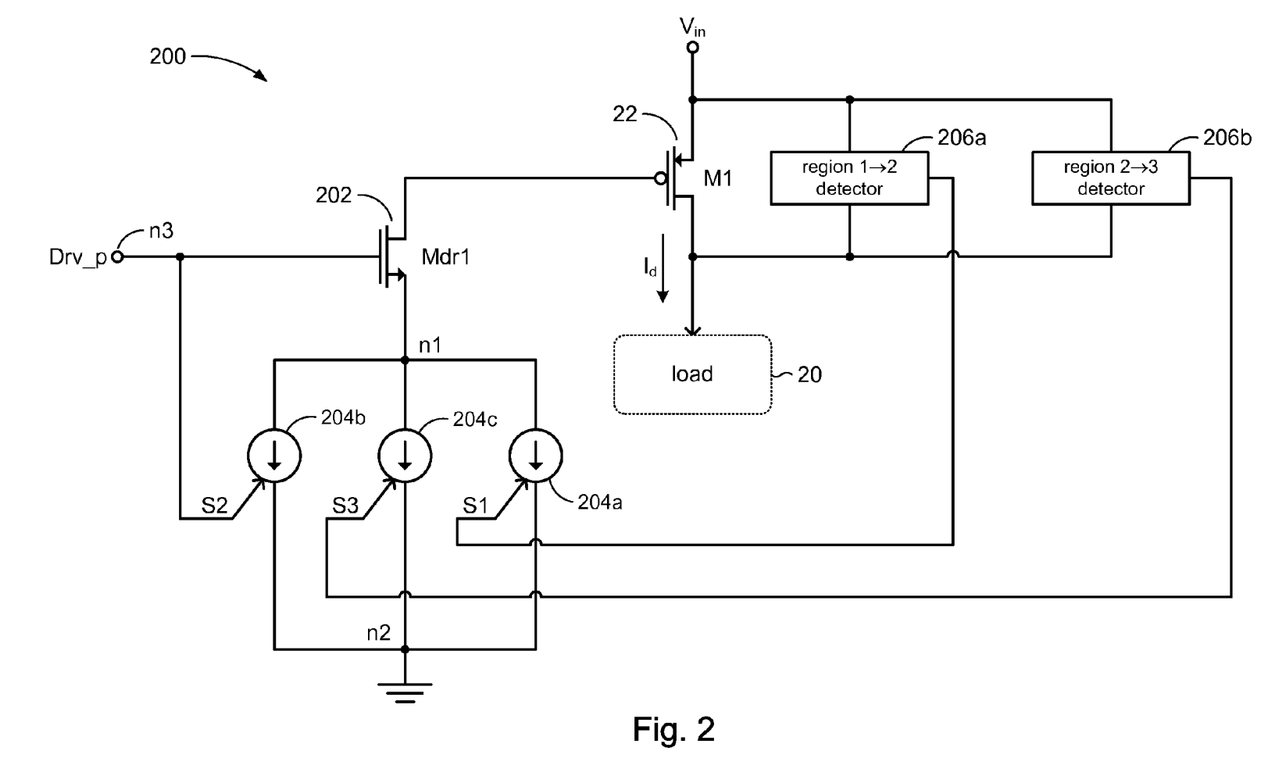
FIG. 2 represents a high level diagram of circuitry in accordance with the present disclosure.

FIG. 1 illustrates a conventional switching profile 100 typically used to drive the gate of a switching device (e.g., M1 in FIG. 2). FIG. 1 further illustrates a shaped switching profile 120 for driving the gate of a switching device in accordance with the present disclosure. Examples of switching devices include insulated gate field effect transistors (IGFETs), metal oxide FETs (MOSFETs) and the like. The switching devices may be n-channel devices (e.g., NMOS devices) or p-channel devices (e.g., PMOS devices). The switching device may be a power device such as a power FET and the like.

The top waveforms 102, 122 of respective switching profiles 100, 120 represent drain current $I_d$ as a function of time. The bottom waveforms 104, 124 of respective switching profiles 100, 120 represent the absolute value of the gate-source voltage |Vgs| as a function of time. The bottom waveforms 104, 124 depict a parameter referred to as rise time (tr), which indicates the turn on time of the switching device. The voltage $V_{th}$ refers to the gate threshold voltage. The switching profiles 100, 120 depict the three operating regions of a switching device: off region (region 1), saturation region (region 2), and linear region (region 3).

In accordance with the present disclosure, a drive signal can be generated that drives the gate of the switching device at different speeds depending on the operating region of the switching device. The phrase "driving speed" may be used to refer to the speed at which a gate driver charges or discharges the gate of the switching device to turn ON the switching device.

In some embodiments, for example, the gate of the switching device may be driven at a higher speeds during operating regions 1 and 3 of the switching device, than during operating region 2. The shaped switching profile 120 in FIG. 1 illustrates this graphically. The bottom waveform 124 illustrates the time function for the gate drive voltage. The top waveform 122 shows the resulting drain current profile. As can be seen, the slope, namely $$\frac{dI_d}{dt}$$

in region 2 is reduced as compared to the slope in region 2 during conventional switching, thus reducing glitch artifacts during operation of the switching device. In addition, the rise time (tr) can remain the same so that switching efficiency is not impacted.

Referring to FIG. 2, the discussion will now turn to a description of circuitry in accordance with the present disclosure. FIG. 2 schematically represents drive circuitry 200 in accordance with some embodiments to drive a switching device 22 (M1). The switching device 22 may be connected to provide current $I_d$ to a load 20. The circuitry in FIG. 2 is configured for switching device 22 as a PMOS device, but in other embodiments the circuitry can be configured to drive an NMOS device The drive circuitry 200 may include a driver 202, which in some embodiments may comprise a switching device Mdr1. The driver 202 includes a first terminal connected to the gate terminal of switching device 22. The gate terminal of driver 202 may connected to a node n3 to receive an input drive signal Drv_p from a source (not shown) that drives switching device 22.

The drive circuitry 200 may include a plurality of current sources 204a, 204b, 204c (S1, S2, S3). The current sources 204a-204c may be connected in parallel between a node n1 and a node n2. Node n1 may be connected to a second terminal of switching device Mdr1. Node n2 may be connected to a voltage potential such as ground potential. The current sources 204a-204c may include control terminals to enable or disable operation of the current sources. In some embodiments, the input drive signal Drv_p may be provided as a control signal to one of the current sources (e.g., current switch 204b). The current sources 204a-204c may determine the driving speed of the gate of switching device 22.

The drive circuitry 200 may include detectors 206a, 206b. The detectors 206a, 206b may be connected to the switching device 22 in order to detect the current $I_d$ through the switching device. The output of detectors 206a, 206b may be provided as control signals to some of the current sources. In a particular embodiment, for example, the output of detector 206a may be connected to current source 204a and the output of detector 206b may be connected to current source 204c.

In accordance with the present disclosure, the output of detectors 206a, 206b may be indicative of the operating region in which switching device 22 is operating in. In some embodiments, the output of detectors 206a, 206b may be indicative of the switching device 22 transitioning from one operating region to another operating region. In a particular embodiment, for example as shown FIG. 2, detector 206a may output a signal that indicates the switching device 22 transitioning from operating region 1 to operating region 2, and similarly detector 206b may output a signal that indicates the switching device 22 transitioning from operating region 2 to operating region 3.

Figure 2A:
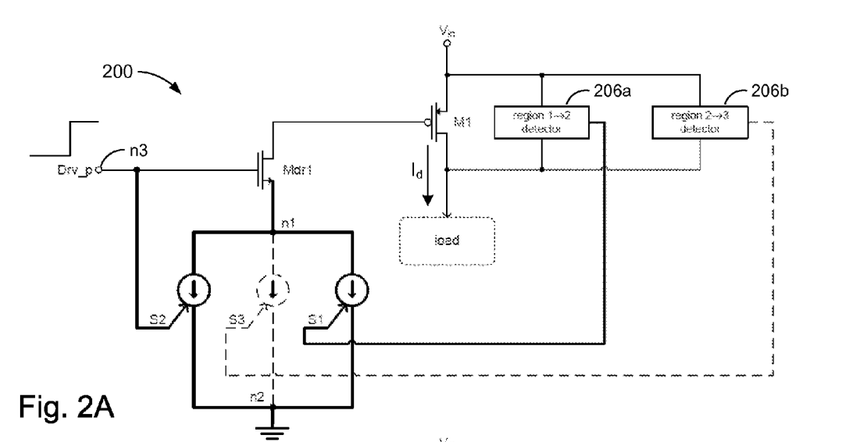
FIGS. 2A, 2B, 2C illustrate a sequence of operations of the circuitry shown in FIG. 2.

Referring to FIGS. 2A, 2B, and 2C, the discussion will now turn to a description of an illustrative sequence of operations of drive circuit 200 in accordance with the particular embodiment shown in FIG. 2 in response to the input drive signal Drv_p presenting a rising edge at node n3. FIG. 2A illustrates operation of the drive circuit 200 when M1 operates in operating region 1. As can be seen in FIG. 2A, in this particular embodiment, the current sources S2 and S1 are enabled and thus the driving speed of M1 is determined by current sources S2 and S1. As M1 in this particular embodiment is a PMOS device, the charge on the gate of M1 is being removed at a rate determined by current sources S2 and S1. The time profile of the driving current $I_d$ in operating region 1 is thus determined by current sources S2 and S1; see, for example, bottom waveform 122 in FIG. 1.

Figure 2B:
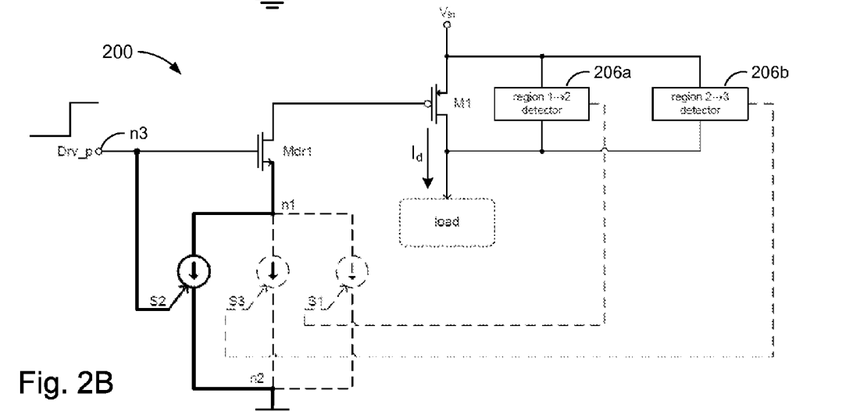

FIG. 2B illustrates operation of the drive circuit 200 when M1 operates in operating region 2. As can be seen in FIG. 2B, in this particular embodiment, only current source S2 is enabled and so the driving speed of M1 is determined only by current source S2 in operating region 2. The charge on the gate of M1 is being removed at a rate determined by current source S2. The time profile of the driving current $I_d$ in operating region 2 is thus determined only by current source S2, as can be seen, for example, in bottom waveform 122 in FIG. 1.

Figure 2C:
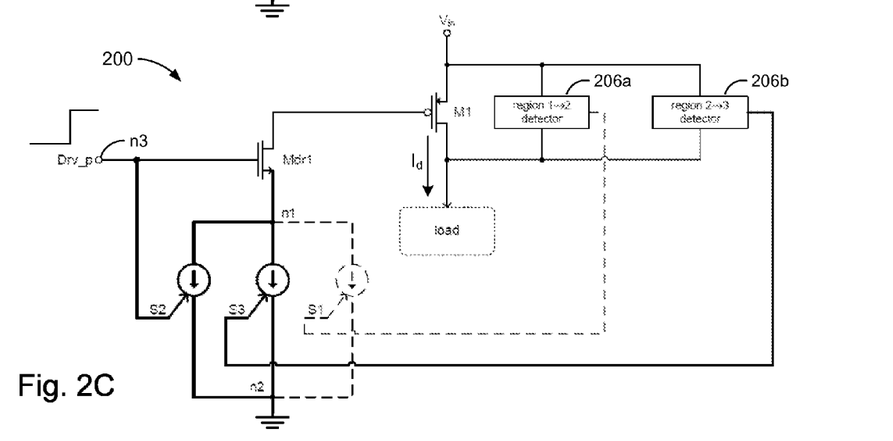

FIG. 2C illustrates operation of the drive circuit 200 when M1 operates in operating region 3. As can be seen in FIG. 2C, in this particular embodiment, the current sources S2 and S3 are enabled and thus the driving speed of M1 is determined by current sources S2 and S3. Accordingly, the charge on the gate of M1 is being removed at a rate determined by current sources S2 and S3. The time profile of the driving current $I_d$ in operating region 3 is thus determined by current sources S2 and S3, referring again, for example, to bottom waveform 122 in FIG. 1.

Figure 3A:
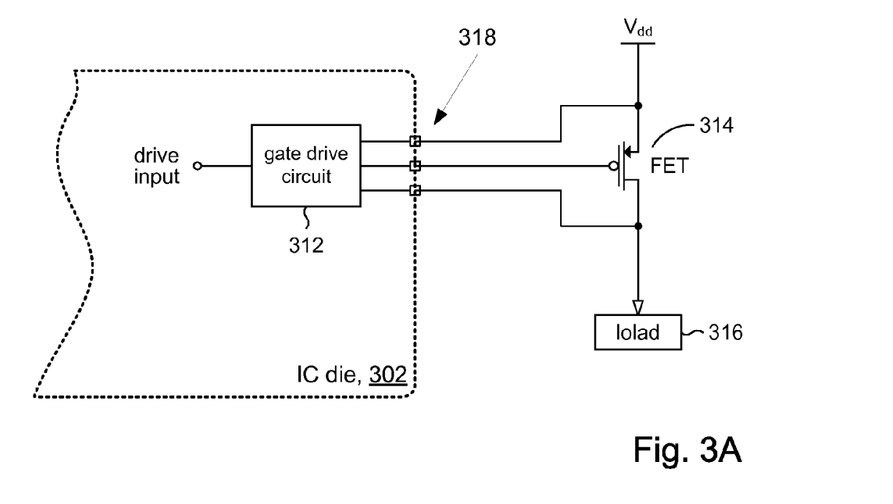
FIGS. 3A and 3B illustrate typical examples of how circuitry in accordance with the present disclosure may be embodied.
Figure 3B:
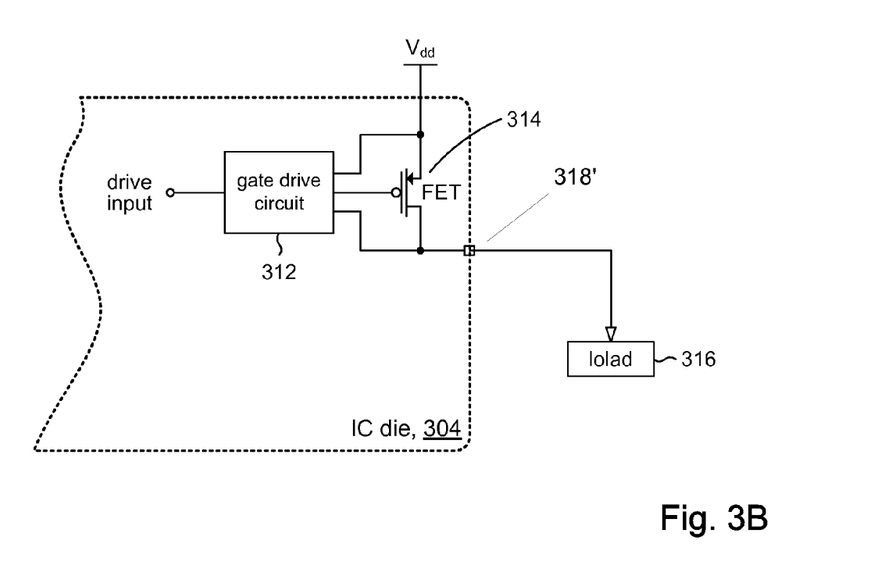

FIGS. 3A and 3B illustrate examples of how a circuit in accordance with the present disclosure may be embodied. FIG. 3A, for example, shows an example in which gate drive circuit 312 may be formed on the die of an integrated circuit (IC) chip, 302, separately from external switching device 314 that drives load 316. The IC die 302 may include pinouts 318 to connect the die to the external switching device 314. FIG. 3B shows an example of an IC die 304 comprising gate drive circuit 312 and switching device 314 formed on the die. A suitable pinout 318' may be provided to allow for a connection to load 316. In FIGS. 3A and 3B, the drive input can come from other circuitry (not shown) that is on the IC die or from circuitry (not shown) that is separate from the IC die.

Figure 4:
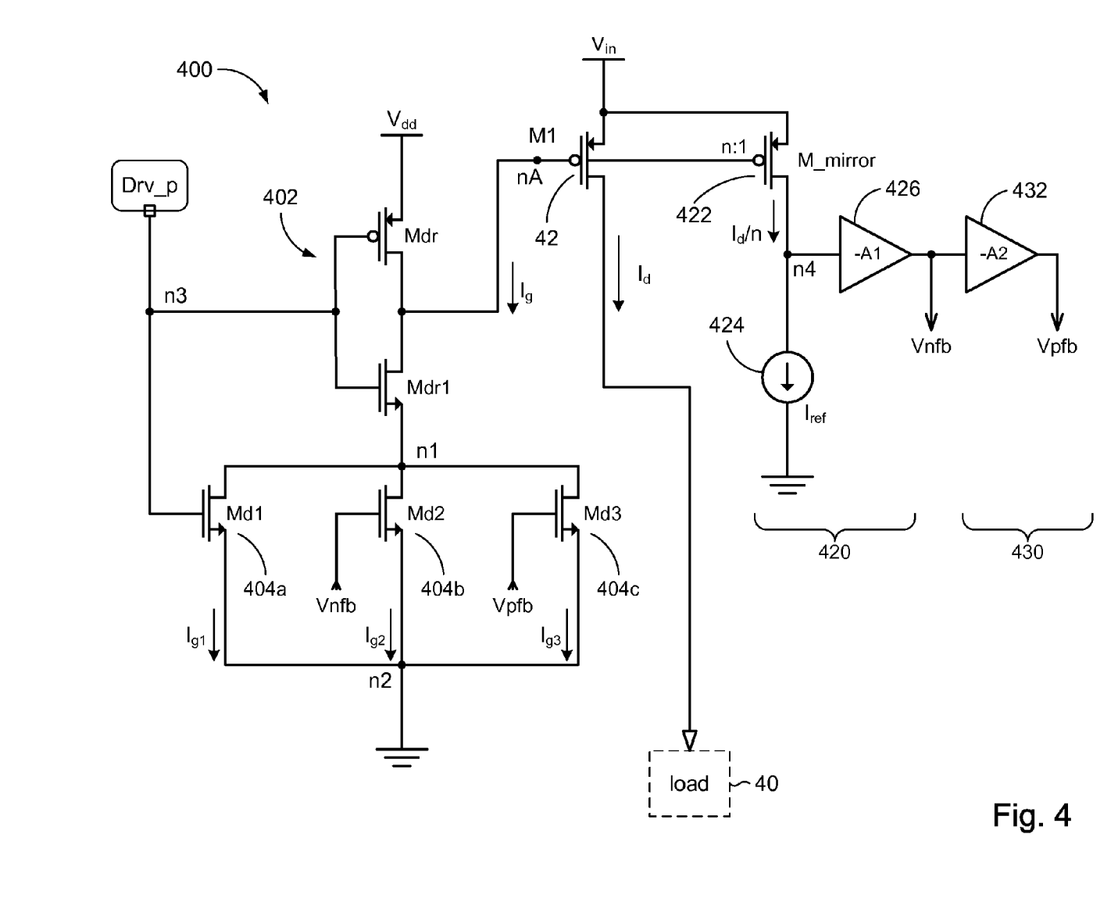
FIG. 4 shows some circuit details in accordance with an embodiment of the present disclosure.

Referring now to FIG. 4, the discussion will turn to a description of an embodiment of a gate drive circuit 400 in accordance with the present disclosure. The figure shows a switching device 42 connected to load 40. The switching device 42 may be driven by the gate drive circuit 400 in response to an input drive signal Drv_p.

In some embodiments, the gate drive circuit 400 may include a driver section 402. The driver section 402 may be an inverter comprising switching devices Mdr (e.g., NMOS device) and Mdr1 (e.g., PMOS device). The inverter input may be connected to receive the input drive signal Drv_p at node n3. The inverter output may be connected to the gate of switching device 42. The inverter may be connected between a first voltage potential (e.g., $V_{dd}$) and node n1.

A plurality of switches 404a, 404b, 404c (Md1, Md2, Md3) may be connected between nodes n1 and n2. In some embodiments, the switches 404a-404c may be NMOS devices. Node n2 may be connected to a voltage potential (e.g., ground). Switch 402a may be connected to node n3. The driving speed on the gate of M1 may be determined by the gate current $I_g$, which in turn may be determined by the current flows $I_{g1}$, $I_{g2}$, and $I_{g3}$ through Md1, Md2, and Md3, respectively.

The gate drive circuit 400 may include detector 420, comprising FET 422, current reference 424, and inverting amplifier 426. Depending on implementation, FET 422 can be either a PMOS device or an NMOS device. In various embodiments, inverting amplifier 426 can be realized as a CMOS inverter or buffer. FET 422 may be connected as a current mirror with switching device 42. The gate width and/or gate length of FET 422 may be sized relative to the switching device 42 by a factor 'n' to achieve a given current reduction ratio of n:1.

The FET 422 and current reference 424 constitute a current comparator. Node n4 represents the output of the current comparator. Node n4 will flip between LO (e.g., 0V) and HI (e.g., >0V) depending on the relationship between $I_d/n$ and $I_{ref}$ of current reference 424. The inverting amplifier 426 can amplify the comparator output (node n4). In some embodiments, the inverting amplifier 426 may be a high gain amplifier. The output Vnfb of the inverting amplifier 426 may be connected to switching device 404b.

The gate drive circuit 400 may include a second detector 430 comprising inverting amplifier 432. In various embodiments, inverting amplifier 432 can be realized as a CMOS inverter or buffer. In the particular embodiment shown, the output Vnfb feeds into the inverting amplifier 432. In some embodiments, the inverting amplifier 426 may be a high gain amplifier. In accordance with an embodiment, the inverting amplifier 432 may be designed to provide a predetermined delay T so that the output Vpfb is delayed in time relative to Vnfb by a time τ. The output Vpfb of the comparator may be connected to switching device 404c.

In operation, when Drv_p is LO, node nA is pulled up HI (via Mdr) so that M1 and M_mirror are both OFF (non-conducting). Node n4 is pulled down (LO) by the current source $I_{ref}$. Vnfb is HI by operation of the inverting amplifier 426 and Vpfb is LO by operation of the inverting amplifier 432. Md1 is OFF because Drv_p is LO, Md2 is ON because Vnfb is HI, and Md3 is OFF because Vpfb is LO. Mdr1 is OFF because Drv_p is LO. Since Mdr1 is OFF, the ON/OFF states of Md1, Md2, and Md3 do not affect the how the gate (node nA) of M1 is being driven.

When Drv_p transitions from LO to HI (presents a rising edge on node n3), Mdr turns OFF and Mdr1 turns ON. Md1 also turns ON, and Md2 is ON because Vnfb is already HI. The gate of M1 starts discharging (|Vgs| increases) at a rate determined by current flows $I_{g1}+I_{g2}$ and the on resistance (Ron) of Md1 and Md2, and current $I_d$ begins to flow. Md3 remains OFF as Vpfb is still LO. One of ordinary skill will understand that M1 is operating in region 1.

As node nA approaches the value of $V_{in}-V_{th}$, where $V_{th}$ is the threshold voltage of M1 and M_mirror, node n4 will be pulled up (go HI) when current $I_d/n>I_{ref}$. Vnfb becomes LO, which turns OFF Md2. Vpfb remains LO because of the delay τ of inverting amplifier 432. As a result, the rate of increase (driving speed) of |Vgs| is now determined only by current flow $I_{g1}$ the Ron of Md1; the driving speed is slower. One of ordinary skill will understand that the operation of M1 is transitioning from operating in region 1 to operating region 2.

After a time delay of τ, Vpfb becomes HI and turns on Md3. The driving speed of |Vgs| is now determined by current flow $I_{g1}$ and $I_{g3}$ and the Ron of Md1 and Md3. One of ordinary skill will understand that the operation of M1 is transitioning from operating in region 2 to operating region 3.

One of ordinary skill will understand from the foregoing that the transition of the operation of M1 from operating region 1 to operating region 2 can be established by properly setting $I_{ref}$ of current reference 424. Similarly, one of ordinary skill will understand from the foregoing that the transition of the operation of M1 from operating region 2 to operating region 3 can be established by designing the inverting amplifier 432 with a suitable delay τ (e.g., by selecting a suitable RC time constant in a delay block in the inverting amplifier 432) that is long enough for the operation of M1 to pass operating region 2 in to operating region 3.

Figure 5:
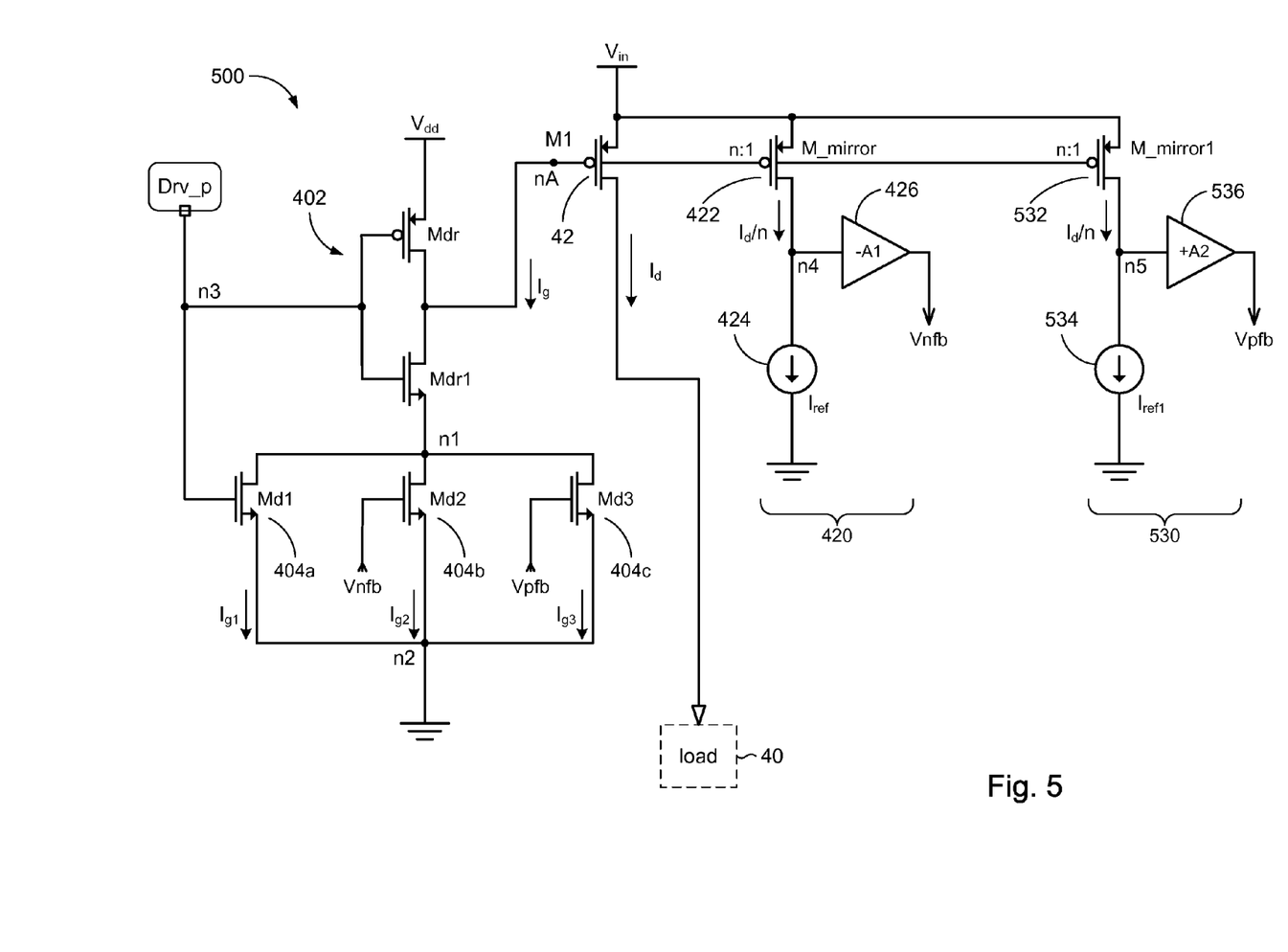
FIG. 5 shows some circuit details in accordance with another embodiment of the present disclosure.

Referring to FIG. 5, another embodiment of a gate drive circuit 500 in accordance with the present disclosure will now be described. The gate drive circuit 500 is an alternative to the embodiment shown in FIG. 4. Accordingly, circuit elements common to both FIGS. 4 and 5 are represented by the same reference numerals. The gate drive circuit 500 includes a detector 530 in place of detector 430 shown in FIG. 4.

The detector 530 may comprise FET 532, current reference 534, and non-inverting amplifier 536. FET 532 may be connected as a current mirror with switching device 42. In some embodiments, the gate width and/or gate length of FET 532 may be sized the same as FET 422 in FIG. 4 to achieve the same current reduction ratio of n:1. In other embodiments, FET 532 may be sized differently from FET 422. $I_{ref1}$ of current reference 534 may be higher than $I_{ref}$ of current reference 424.

The FET 532 and current reference 534 constitute another current comparator. Node n5 represents the output of the current comparator. Node n5 will flip between LO (e.g., 0V) and HI (e.g., >0V) depending on the relationship between $I_d/n$ and $L_{ref1}$ of current reference 534. The non-inverting amplifier 536 can amplify the comparator output (node n5). In some embodiments, the non-inverting amplifier 536 may be a high gain amplifier. The output Vpfb of the non-inverting amplifier 536 may be connected to switching device 404b.

In operation, when Drv_p is LO, node nA is pulled up HI (via Mdr) so that M_mirror, and M_mirror1 both OFF (non-conducting). Node n4 is pulled down (LO) by the current source $I_{ref}$. Vnfb is HI by operation of the inverting amplifier 426 and Vpfb is LO by operation of the non-inverting amplifier 536. Md1 is OFF because Drv_p is LO, Md2 is ON because Vnfb is HI, and Md3 is OFF because Vpfb is LO. Mdr1 is OFF because Drv_p is LO. Since Mdr1 is OFF, the ON/OFF states of Md1, Md2, and Md3 do not affect the how the gate (node nA) of M1 is being driven.

When Drv_p transitions from LO to HI (presents a rising edge on node n3), Mdr turns OFF and Mdr1 turns ON. Md1 also turns ON, and Md2 is ON because Vnfb is already HI. The gate of M1 starts discharging (|Vgs| increases) at a rate determined by current flows $I_{g1}+I_{g2}$ and the on resistance (Ron) of Md1 and Md2, and current $I_d$ begins to flow.

As node nA approaches the value of $V_{in}-V_{th}$, where $V_{th}$ is the threshold voltage of M1, M_mirror, and M_mirror1, node n4 will be pulled up (go HI) when current $I_d/n>I_{ref}$. Vnfb becomes LO, which turns OFF Md2. Vpfb will remains LO until $I_d/n>L_{ref}$ (recall that $T_{ref}<I_{ref1}$). Accordingly, the rate of increase (driving speed) of |Vgs| is determined only by current flow $I_{g1}$ the Ron of Md1.

As $I_d$ continues to increase, Vpfb becomes HI when $I_d/n>I_{ref1}$, which turns on Md3. The driving speed of |Vgs| is now determined by current flow $I_{g1}$ and $I_{g3}$ and the Ron of Md1 and Md3.

One of ordinary skill will understand from the foregoing that the transition of the operation of M1 from operating region 2 to operating region 3 can be established by properly setting $I_{ref1}$ of current reference 534.

Figure 6:
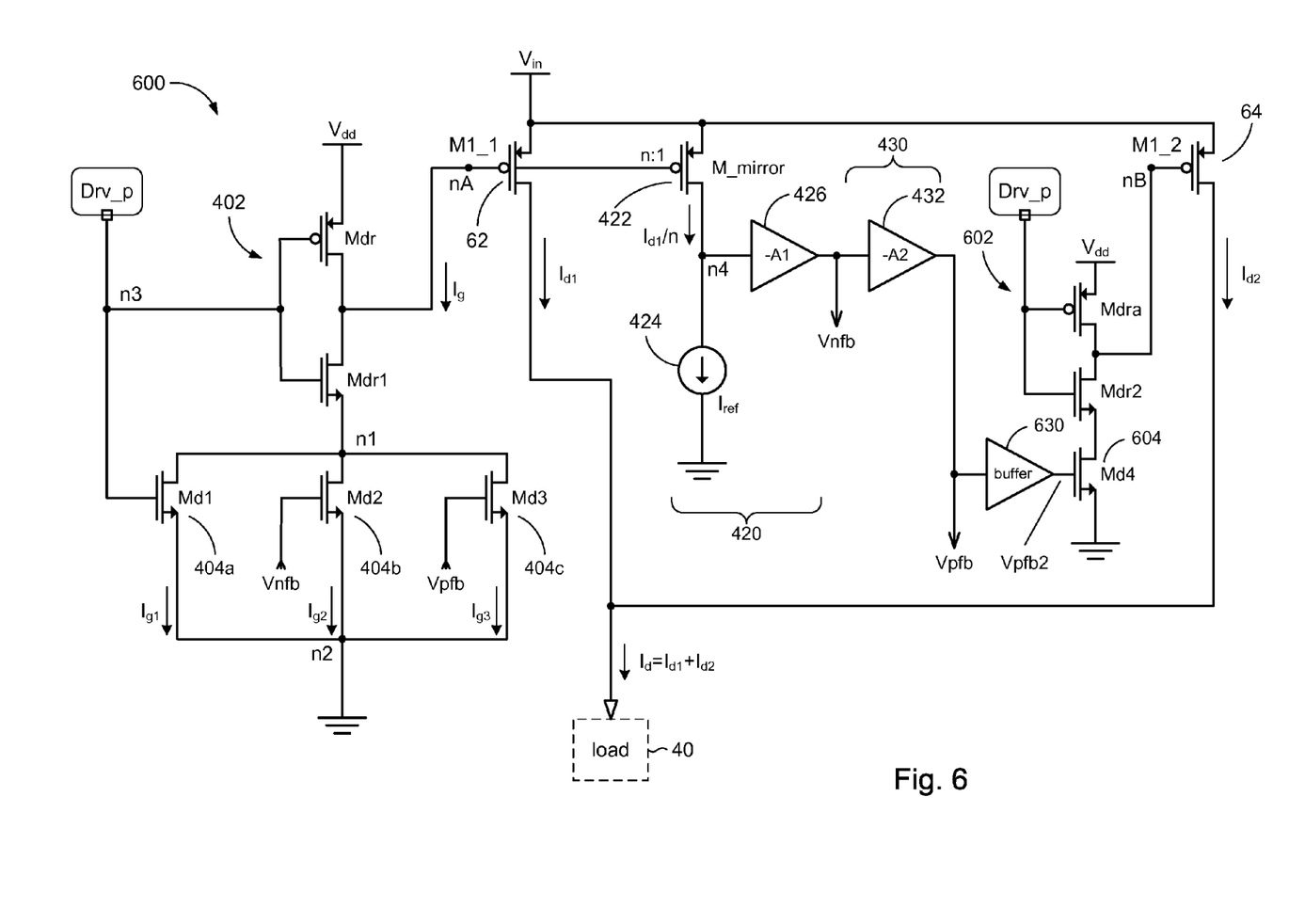
FIG. 6 shows some circuit details in accordance with yet another embodiment of the present disclosure.

Referring to FIG. 6, another embodiment of a gate drive circuit 600 in accordance with the present disclosure will now be described. The gate drive circuit 600 is an alternative to the embodiment shown in FIG. 4. Accordingly, circuit elements common to both FIGS. 4 and 6 are represented by the same reference numerals.

In the embodiment depicted in FIG. 6, the load 40 is driven by two switching devices 62, 64, rather than by a single switching device such as 42 in FIG. 4. The current $I_d$ that drives load 40 comprises current $I_{d1}$ from switching device 62 (M1_1) and current $I_{d2}$ from switching device 64 (M1_2). In some embodiments, M1_1 may be much smaller than M1_2.

The gate drive circuit 600 may include a second driver section 602, in addition to driver section 402, that is driven by Drv_p. The driver section 602 may be an inverter comprising switching devices Mdra (e.g., NMOS device) and Mdr2 (e.g., PMOS device). The inverter output may be connected to the gate of switching device 64. The gate drive circuit 600 may further include a switch 604 (Md4) connected between the inverter and ground potential.

The gate drive circuit 600 may further include a buffer 630 that receives Vpfb from inverting amplifier 432 and outputs a signal Vpfb2. In accordance with an embodiment, the buffer 630 may be designed to provide a predetermined delay τ1 so that the output Vpfb2 of buffer 630 is delayed in time relative to Vpfb by a time τ1. The output Vpfb2 may be connected to switching device 604.

In operation, when Drv_p is LO, node nA is pulled up HI (via Mdr) so that M1_1, M1_2, and M_mirror are OFF (non-conducting). Node n4 is pulled down (LO) by the current source $I_{ref}$. Vnfb is HI by operation of the inverting amplifier 426. Vpfb is LO by operation of the inverting amplifier 432 and Vpfb2 is LO because buffer 630 is non-inverting. Md1 is OFF because Drv_p is LO, Md2 is ON because Vnfb is HI, and Md3 is OFF because Vpfb is LO. Mdr1 and Mdr2 are OFF because Drv_p is LO. Since Mdr1 is OFF, the ON/OFF states of Md1, Md2, and Md3 do not affect the how the gate (node nA) of M1 is being driven. Likewise, since Mdr2 is OFF, the ON/OFF state of Md4 does not affect the how the gate (node nB) of M1_2 is being driven.

When Drv_p transitions from LO to HI, Mdr turns OFF, and Mdr1 and Mdr2 turn ON. Md1 also turns ON, and Md2 is ON because Vnfb is already HI. The gate of MU starts discharging (|Vgs| increases) at a rate determined by current flows $I_{g1}+I_{g2}$ and the on resistance (Ron) of Md1 and Md2, and current $I_{d1}$ begins to flow. Md3 and Md4 remain OFF as Vpfb and Vpfb2, respectively, are still LO.

As node nA approaches the value of $V_{in}-V_{th}$, where $V_{th}$ is the threshold voltage of M1_1 and M_mirror, node n4 will be pulled up (go HI) when current $I_{d1}/n>I_{ref}$. Vnfb becomes LO, which turns OFF Md2. Vpfb remains LO because of the delay τ of inverting amplifier 432, as does Vpfb2. As a result, the rate of increase (driving speed) of |Vgs| is now determined only by current flow $I_{g1}$ the Ron of Md1.

After a time delay of τ, Vpfb becomes HI and turns on Md3. Vpfb2 remains LO due to the delay in buffer 630. The driving speed of |Vgs| is now determined by current flow $I_{g1}$ and $I_{g3}$ and the Ron of Md1 and Md3.

After another time delay of τ1 in buffer 630, Vpfb2 will go HI to turn ON Md4, which effectively enables operation of the driver section 602 to begin discharging the gate of M1_2. One of ordinary skill in the art will understand that the delay τ1 in buffer 630 can be designed to be long enough (e.g., by selecting a suitable value for the RC time constant in a delay block in the buffer) to allow M1_1 to fully turn ON.

Figure 7:
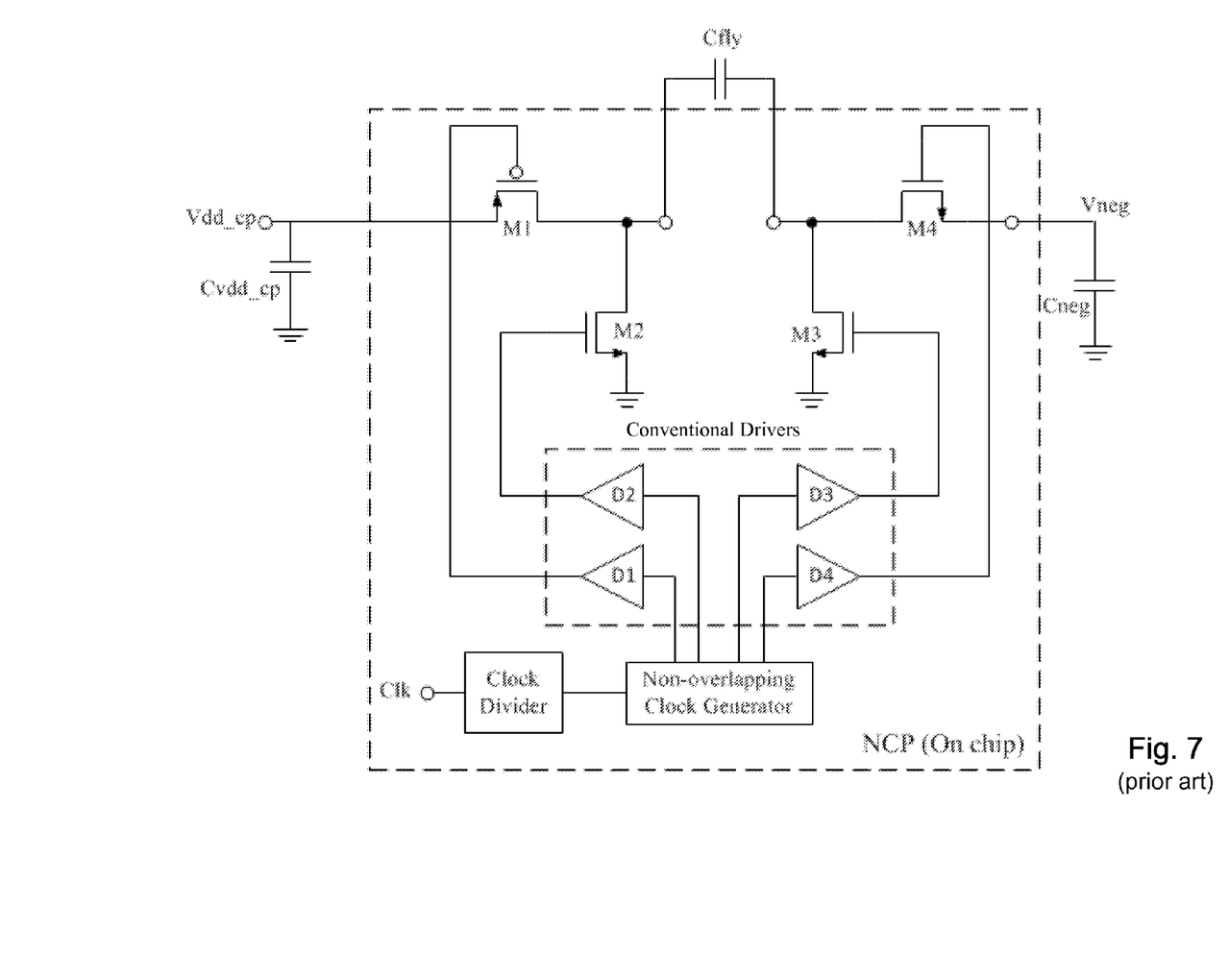
FIG. 7 show a design of a typical negative charge pump.

The discussion will now turn to a description of a usage scenario for circuitry in accordance with the present disclosure. FIG. 7, for example, shows the circuitry for a negative charge pump (NCP) using conventional drivers D1-D4. Drivers D1-D4 may be inverters; e.g. Mdr and Mdr1 in FIG. 4 are configured as an inverter. The output of the clock generator provide input drive signals (e.g., Drv_p) to drive FETs M1-M4 comprising the NCP via drivers D1-D4.

Figure 8:
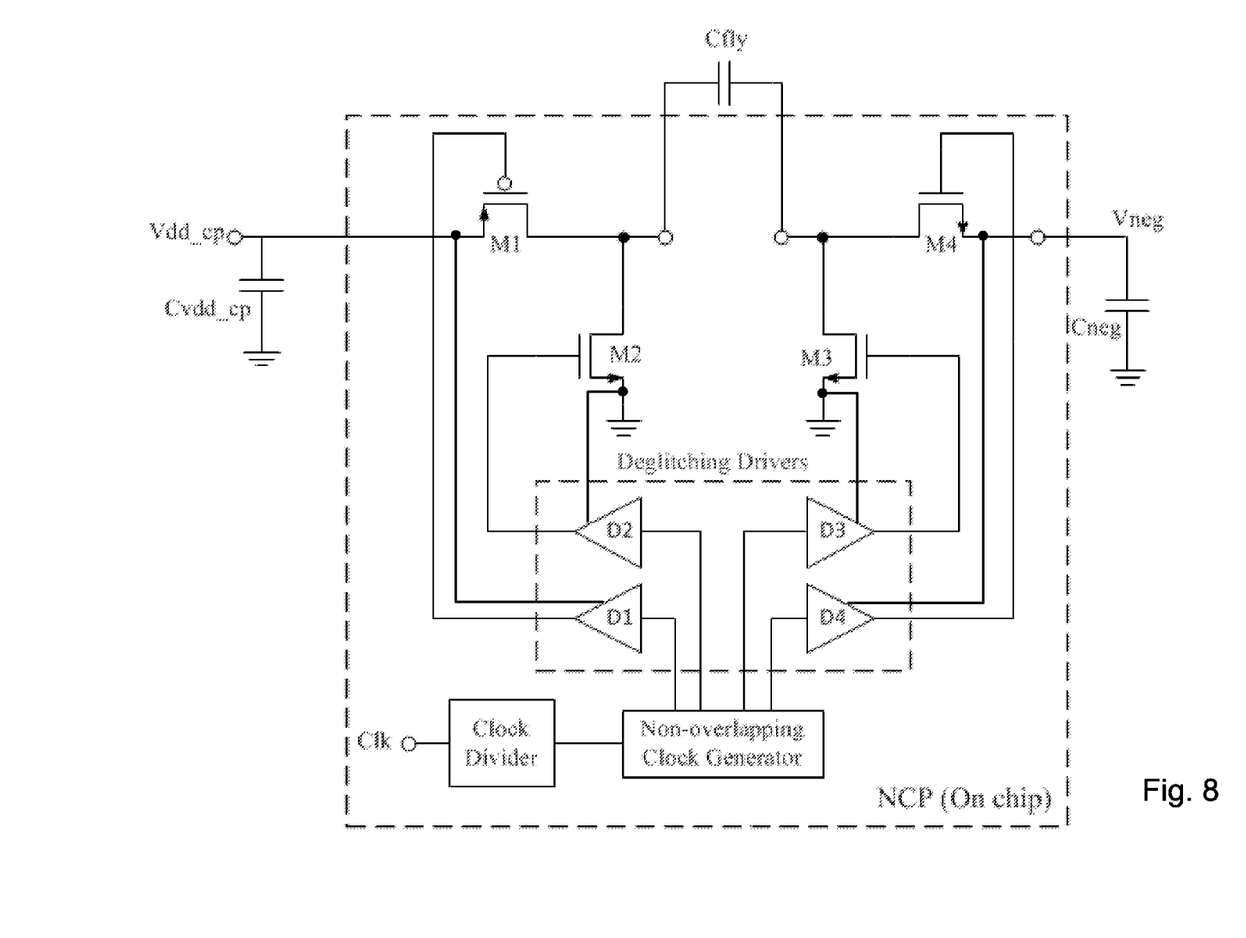
FIG. 8 illustrates how circuitry of the present disclosure may be incorporated into the negative charge pump shown in FIG. 7.

FIG. 8 shows an NCP configured with drivers D1-D4 in accordance with the present disclosure. Each FET M1-M4 includes an addition feedback line to its respective driver D1-D4. FIG. 8 shows that the improved drivers D1-D4 can replace into existing drivers in various circuits with very little modification.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. A circuit comprising:
   a transistor device having first and second terminals and a control terminal, the first terminal for a connection to an input voltage, the second terminal for a connection to an electrical load; and
   a driver circuit connected to the transistor device and operative to drive the transistor device in response to an input signal provided to the driver circuit, the driver circuit comprising:
   a first switch having first and second terminals, the first terminal connected to the control terminal of the transistor device, the first switch further having a control terminal for a connection to a source of the input signal;
   a plurality of second switches arranged in parallel and connected between a first node and a second node, the first node connected to the second terminal of the first switch, the second node connectable to a first voltage potential; and
   a region detector circuit connected to the transistor device, the region detector circuit operative to generate output signals responsive to an operating region of the transistor device,
   the second switches connected to the region detector circuit, the output signals of the region detector circuit operative to control one or more of the second switches.

2. The circuit of claim 1 wherein the region detector circuit is further operative to generate a first output signal in response the transistor device transitioning from a first operating region to a second operating region and to generate a second output signal in response the transistor device transitioning from the second operating region to a third operating region.

3. The circuit of claim 1 wherein the control terminal of the first switch is connected to a first one of the second switches.

4. The circuit of claim 1 wherein the first terminal of the first switch is connected to a second voltage potential.

5. The circuit of claim 1 further comprising a third switch having first and second terminals and a control terminal, the first terminal connected to a second voltage potential, the second terminal connected to the control terminal of the transistor device, the control terminals of the first and third switches connected together.

6. The circuit of claim 1 wherein the transistor device and the driver circuit are components on an integrated circuit (IC) die.

7. The circuit of claim 1 wherein the region detection circuit is operative to sense a current flow across the first and second terminals of the transistor device.

8. The circuit of claim 1 wherein the region detection circuit comprises a current detector and a comparator connected to the current detector, the output signals of the region detection circuit comprising an output of the comparator.

9. The circuit of claim 8 wherein the region detection circuit further comprises a second current detector and a second comparator connected to the second current detector, the output signals of the region detection circuit further comprising an output of the second comparator.

10. The circuit of claim 8 wherein the region detection circuit further comprises an amplifier connected to the comparator, the output signals of the region detection circuit further comprising an output of the amplifier.

11. A circuit comprising:
first means for driving a control terminal of a transistor device;
second means, connected to the transistor device, for generating one or more control signals responsive to an operating region in which the transistor device is operating;
third means, connected to the first means and to the second means, for varying a current flow through the first means responsive to the one or more control signals from the second means,
wherein the second means generates a first control signal in response the transistor device transitioning from a first operating region to a second operating region and generates a second control signal in response the transistor device transitioning from the second operating region to a third operating region.

12. The circuit of claim 11 wherein the first operating region of the transistor device is a cutoff region, wherein the second operating region of the transistor device is a saturation region, wherein the third operating region of the transistor device is a linear region.

13. The circuit of claim 11 further comprising the transistor device, the first means connected to the control terminal of the transistor device.

14. The circuit of claim 11 wherein the circuit is disposed on an IC die.

15. The circuit of claim 11 wherein the second means comprises a current detector and a comparator connected to the current detector, the output signals of the region detection circuit comprising an output of the comparator.

16. The circuit of claim 11 wherein the second means further comprises an amplifier connected to the comparator, the output signals of the region detection circuit further comprising an output of the amplifier.

17. The circuit of claim 11 wherein the second means further comprises a second current detector and a second comparator connected to the second current detector, the output signals of the region detection circuit further comprising an output of the second comparator.

18. A circuit comprising:
first and second output devices for a connection to a load;
a first driver connected to a control terminal of the first output device;
a second driver connected to a control terminal of the second output device;
a plurality of switches arranged in parallel and connected between a first node and a second node, the first node connected to the second terminal of the driver, the second node connectable to a first voltage potential;
a detector circuit connected to the first output device, the detector circuit operative to generate output signals responsive to an operating region of the first output device, the switches connected to the detector circuit, the output signals of the detector circuit operative to control one or more of the switches; and
a buffer connected to the second driver and receiving one of the output signals from the detector circuit, the buffer operative to enable the second driver in response to said one of the output signals.

19. The circuit of claim 18 wherein the region detector circuit is further operative to generate a first output signal in response the transistor device transitioning from a first operating region to a second operating region and to generate a second output signal in response to the transistor device transitioning from the second operating region to a third operating region.

20. The circuit of claim 18 wherein the detector circuit comprises a current detector and a comparator connected to the current detector, the output signals of the region detection circuit comprising an output of the comparator.

* * * * *